(12) United States Patent
Nirwan et al.

(10) Patent No.: US 10,156,595 B2
(45) Date of Patent: Dec. 18, 2018

(54) POWER SUPPLY GLITCH DETECTOR

(71) Applicant: Microsemi SoC Corp., San Jose, CA (US)

(72) Inventors: Bhawana Singh Nirwan, Hyderabad (IN); Abhishek Lal, Faridabad (IN)

(73) Assignee: MICROSEMI SOC CORP., San Jose, CA (US)

( * ) Notice: Subject to any disclaimer, the term of this patent is extended or adjusted under 35 U.S.C. 154(b) by 0 days.

(21) Appl. No.: 15/831,287

(22) Filed: Dec. 4, 2017

(65) Prior Publication Data

US 2018/0164351 A1 Jun. 14, 2018

(30) Foreign Application Priority Data

Dec. 9, 2016 (IN) .............................. 201621042167

(51) Int. Cl.
| | |
|---|---|
| *G01R 19/165* | (2006.01) |
| *G01R 19/25* | (2006.01) |
| *H03K 5/1252* | (2006.01) |
| *G01R 29/027* | (2006.01) |
| *G01R 31/317* | (2006.01) |

(Continued)

(52) U.S. Cl.
CPC ..... *G01R 19/16547* (2013.01); *G01R 19/165* (2013.01); *G01R 19/25* (2013.01); *G01R 19/2503* (2013.01); *G01R 29/02* (2013.01); *G01R 29/023* (2013.01); *G01R 29/027* (2013.01); *G01R 29/0276* (2013.01); *G01R 31/317* (2013.01); *H03K 5/1252* (2013.01);

(Continued)

(58) Field of Classification Search
None
See application file for complete search history.

(56) References Cited

U.S. PATENT DOCUMENTS

| | | |
|---|---|---|
| 6,025,981 A | 2/2000 | Wu |
| 6,751,079 B2 | 6/2004 | Bretschneider |

(Continued)

*Primary Examiner* — Jeffery S Zweizig
(74) *Attorney, Agent, or Firm* — Glass & Assocates; Kenneth D'Alessandro; Kenneth Glass

(57) ABSTRACT

A power supply glitch detector includes a sense node AC coupled to a power supply node on which voltage glitches having a magnitude of $V_{glitch}$ are to be detected. A sensing inverter has an input and an output, the input coupled to the sensing node, the sensing inverter having a trip voltage $V_{trip}$ below which the output of the sensing inverter is at a voltage representing a logic high state and above which the output of the sensing inverter is at a voltage representing a logic low state. An adjustable voltage biasing circuit is coupled to the sensing node to maintain the input of the sensing inverter at a bias voltage $V_{bias}$, wherein $V_{bias}$ is chosen such that either both conditions ($V_{bias}<V_{trip}$) and ($V_{bias}+V_{glitch}>V_{trip}$) or both conditions ($V_{bias}>V_{trip}$) and ($V_{bias}-V_{glitch}<V_{trip}$) are always true.

19 Claims, 5 Drawing Sheets

(51) Int. Cl.
*G01R 29/02* (2006.01)
*H03K 5/1534* (2006.01)
*H03K 5/04* (2006.01)
*H03K 19/177* (2006.01)

(52) U.S. Cl.
CPC ............ *H03K 5/1534* (2013.01); *H03K 5/04* (2013.01); *H03K 19/17768* (2013.01)

(56) References Cited

U.S. PATENT DOCUMENTS

| | | | | |
|---|---|---|---|---|
| 7,085,979 B2* | 8/2006 | Kim | ..................... | G06K 19/073 |
| | | | | 714/733 |
| 7,570,468 B2* | 8/2009 | Bernard | ................. | H02H 9/046 |
| | | | | 361/56 |
| 8,390,360 B2* | 3/2013 | Gist, III | ............. | H01L 27/0285 |
| | | | | 327/306 |
| 8,908,341 B2* | 12/2014 | Prabhu | .................. | H02H 9/046 |
| | | | | 361/111 |
| 9,484,910 B2* | 11/2016 | Mai | ..................... | H03K 17/223 |
| 2003/0226082 A1 | 12/2003 | Kim | | |

* cited by examiner

US 10,156,595 B2

POWER SUPPLY GLITCH DETECTOR

This application claims priority from Indian Patent Application No. 201621042167 filed Dec. 9, 2016, the contents of which are incorporated in this disclosure by reference in their entirety.

The present invention relates to electronic circuits. More particularly, the present invention relates to detection circuits and to power supply glitch detector circuits that detect any kind of positive or negative voltage glitch on a power supply and provide signals as outputs in response to these glitches.

BACKGROUND

Sensitive information in electronic devices is usually protected using various encryption methods. Even though encryption protects the primary channels of the device from hackers, several secondary channels are still prone to attacks.

Side channel attacks are aimed to gain information from the device by targeting these secondary channels of the device like the hardware, timing information, electromagnetic radiation, without limitation. Typical side channel attacks can include: attacking the cache implemented by monitoring the cache; timing attacks implemented by measuring the computation timing of different tasks; power monitoring attacks implemented by measuring the varying nature of device power consumption; electromagnetic attacks implemented by measuring electromagnetic radiation leaked from the device; fault injection attacks implemented by placing the device in abnormal conditions such as abruptly raising or lowering power supply voltage: and/or tampering with the clock, device temperature, without limitation.

Side channel attacks involving power supplies of the device come under the category of fault injection. Glitching the supply voltage (higher or lower) may affect the device in certain ways, some of which include changes to the logic outputs of the circuits affecting further control operations, affecting the on-going device operations like programming/reading from a memory location, without limitation, essentially leaving the device corrupted.

In view of the availability of these power supply side channel hacking procedures, there is a long standing need for the device to be capable of detecting such power supply attacks and take preventive actions against these attacks.

BRIEF DESCRIPTION

A power supply glitch detector is a circuit that detects any kind of voltage glitch on the supply. One embodiment of a circuit in accordance with the present invention detects both positive and negative voltage glitches on the supply and provides active high or low signals as outputs in response to detection of any of these glitches.

In accordance with the present invention, a glitch detector includes a glitch coupling circuit, a bias generating circuit, a glitch detection circuit in the form of a comparator coupled to the bias generating circuit and the glitch coupling circuit, and a pulse stretching circuit.

According to one aspect of the invention, the glitch detector may include two detector cores: one for positive glitch detection and the other for negative glitch detection.

According to another aspect of the invention, the magnitude of the supply glitch that needs to be detected and responded to by the circuit can be configured by applying different control settings.

BRIEF DESCRIPTION OF THE DRAWING FIGURES

The invention will be explained in more detail in the following with reference to embodiments and to the drawing in which are shown:

DETAILED DESCRIPTION

Persons of ordinary skill in the art will realize that the following description of the present invention is illustrative only and not in any way limiting. Other embodiments of the invention will readily suggest themselves to such skilled persons.

Figure 1A:
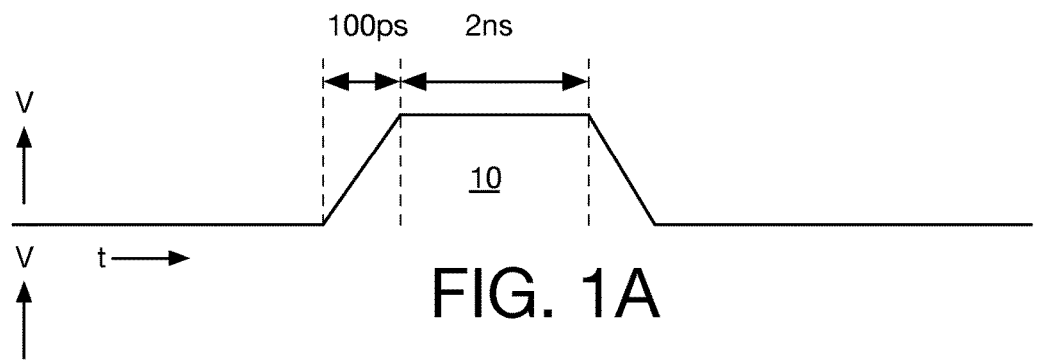
FIGS. 1A and 1B are graphs of voltage vs. time that represent power supply waveforms including, respectively, idealized representations of positive and negative glitch pulses.
Figure 1B:
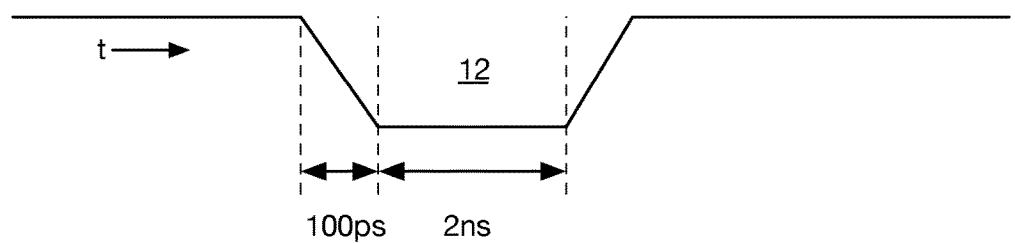

Referring first of all to FIGS. 1A and 1B are graphs of voltage vs. time that represent power supply waveforms including, respectively, idealized representations of positive and negative glitch pulses. In both FIGS. 1A and 1B, the waveforms have nominal steady-state values. In FIG. 1A, an illustrative positive-going glitch is indicated at reference numeral 10 and has rise/fall times of 100 ps and a duration of 2 ns. In FIG. 1B, an illustrative negative-going glitch is indicated at reference numeral 12 and has rise/fall times of 100 ps and a duration of 2 ns. Persons of ordinary skill in the art will appreciate that these waveforms are illustrative only and the present invention is not limited to detection of glitches having the exact characteristics that are shown in FIGS. 1A and 1B.

Figure 2:
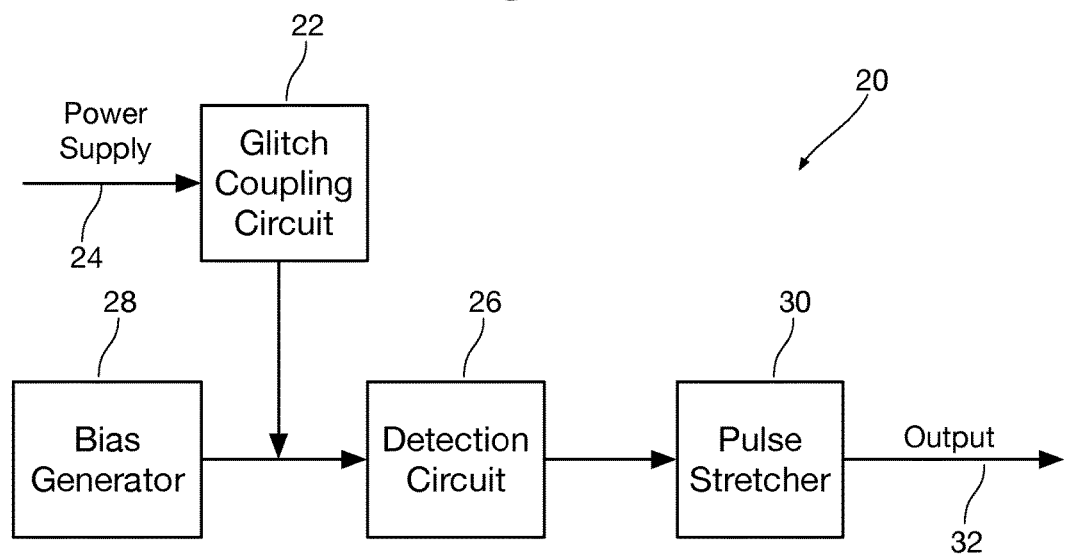
FIG. 2 is a block diagram showing a glitch detector in accordance with one aspect of the present invention.

FIG. 2 is a block diagram showing a glitch detector 20 in accordance with the present invention. Glitch detector 20 includes a glitch coupling circuit 22 coupled to a power supply line 24 on which glitches are to be detected. The glitch is coupled from the output of the glitch coupling circuit 22 to the input of detection circuit 26, which can be an inverter biased at a voltage level $V_{bias}$ using bias generator circuit 28. The detection circuit 26 outputs a pulse having the approximate duration of the input glitch pulse that is stretched using pulse stretcher circuit 30. The output of pulse stretcher circuit 30 at line 32 is the output of the glitch detector circuit 20. This output may be used to raise a flag that will drive one or more circuits to allow the system to take an appropriate action (generate an interrupt, reset or other action without limitation) for the device so as to prevent the hacker from extracting/monitoring the characteristics of the power supply or injecting any fault, thus preventing side channel attacks. In accordance with different aspects of the invention, the glitch detector 20 may be configured to detect positive glitches, negative glitches, or both positive and negative glitches.

Glitch coupling circuit 22 is coupled between the voltage supply voltage line 24, also known as power supply node 24 and the input of the detection circuit 26, which input is called a sensing node. The glitch coupling circuit 22 transfers any voltage glitch occurring on the voltage supply line 24 to the sensing node at the input of the detection circuit 26.

Considering the case of a positive glitch detector, if the input voltage level is below the trip-point $V_{trip}$ of the detection circuit 26, the output is at a first logic state (e.g., logic 1 also referred to as high logic state), indicative that no glitch has been detected. If the input voltage level is above the trip-point $V_{trip}$ of the detection circuit 26, the output transitions to a second logic state opposite the first logic state (e.g., logic 0 also referred to as low logic state), indicative that a glitch has been detected.

In an embodiment where the glitch detector circuit 26 has a trip point of $V_{trip}$, the input of the glitch detection circuit 26 is biased by bias generator circuit 28 to a voltage level of $V_{bias}$ where it remains under steady-state conditions. $V_{bias}$ is set to be lower than $V_{trip}$ by a certain preset known voltage ($\Delta V$). Under the steady-state condition the output of the detection circuit 26 is at the first logic state (e.g., logic 1).

A glitch occurring on the voltage supply line 24 will be coupled to the input of the glitch detection circuit 26. If the glitch raises the input voltage of the glitch detection circuit 26 by more than the preset voltage $\Delta V$, then $V_{bias}+V_{glitch}>V_{trip}$ and it will cause the detection circuit 26 to trip and its output transitions from the first logic state to the second logic state (e.g., logic 0).

When the voltage glitch on the supply terminates, the input voltage to the detection circuit 26 returns to its quiescent value $V_{bias}$. Since now $V_{bias}<V_{trip}$, the output of the detection circuit 26 returns to the first logic state. In this process the output of the detection circuit generates a short pulse (e.g., going from logic 1→0→1 ). This pulse can be stretched using a pulse stretching circuit 30 to generate the output of the glitch detector 20.

Considering the case of a negative glitch detector, the trip-point $V_{trip}$ of the detection circuit 26 is set to be below the steady-state voltage level to the input of the glitch detection circuit 26. Under this steady state condition, the output of the detection circuit 26 is at a first logic level (e.g., logic 0), indicative that no glitch has been detected. If the input voltage level to the glitch detection circuit 26 drops below the trip-point $V_{trip}$ of the detection circuit 26, the output of the glitch detection circuit 26 transitions to the second logic state (e.g., logic 1), indicative that a glitch has been detected.

In a negative glitch detector embodiment where the glitch detector circuit 26 has a trip point of $V_{trip}$, the input of the glitch detection circuit 26 is biased by bias generator circuit 28 to a voltage level of $V_{bias}$ under steady-state conditions. $V_{bias}$ is set to be higher than $V_{trip}$ by a certain preset known voltage ($\Delta V$). Under the steady-state condition the output of the detection circuit 26 is at the first logic level.

A glitch will be coupled to the input of the glitch detection circuit 26. If the glitch lowers the input voltage of the glitch detection circuit 26 by more than the preset voltage $\Delta V$, then $V_{bias}-V_{glitch}<V_{trip}$ and it will cause the output of the detection circuit 26 to transition from the first logic state to the second logic state.

When the voltage glitch on the supply terminates, the input voltage to the detection circuit 26 returns to $V_{bias}$. Since now $V_{bias}>V_{trip}$, the output of the detection circuit 26 returns to the first logic state. In this process the output of the detection circuit generates a short pulse (e.g., going from logic 0→1→0). This pulse can be stretched using a pulse stretching circuit 30 to generate the output of the glitch detector 20.

Figure 3:
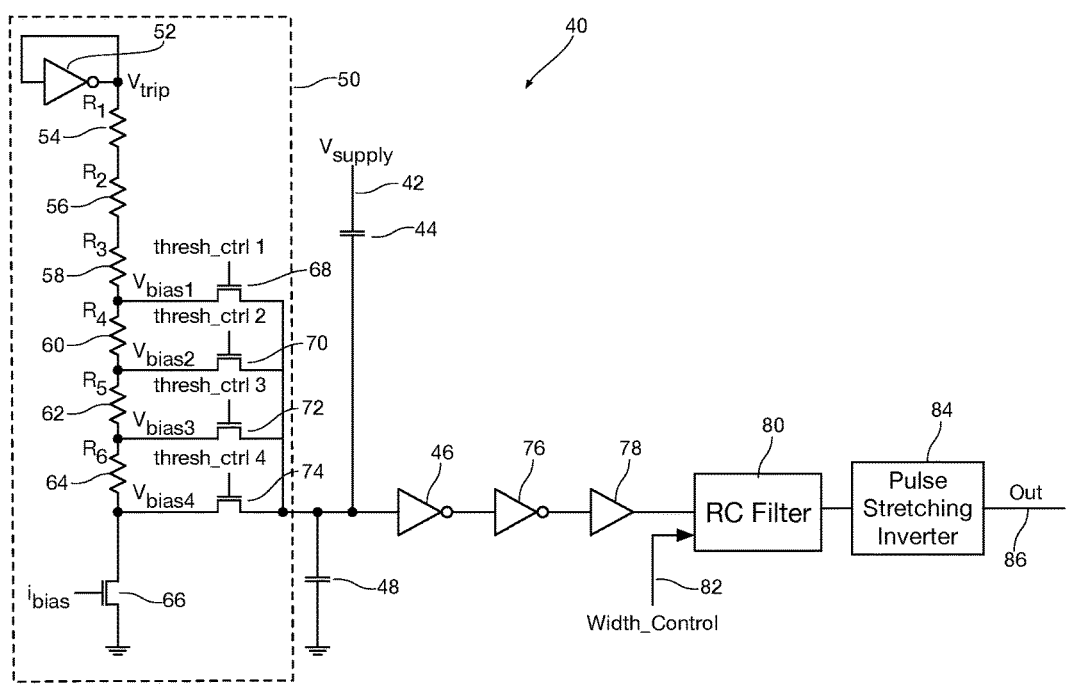
FIG. 3 is a schematic diagram showing an illustrative circuit implementation of the glitch detector of FIG. 2 where the bias generator circuit and the glitch detection circuit are configured to detect a positive-going glitch.

Referring now to FIG. 3, a schematic diagram shows an illustrative circuit implementation of the glitch detector of FIG. 2 where the bias generator circuit and the glitch detection circuit are configured to detect a positive-going glitch. The detection circuit 40 shown in FIG. 3 monitors the voltage on $V_{supply}$ line 42. A first capacitor 44 is coupled between the $V_{supply}$ line 42 and the input of sensing inverter 46. A second capacitor 48 is coupled between the input of sensing inverter 46 and ground. Capacitors 44 and 48 act as a voltage divider for the glitch pulse, with capacitor 44 also acting to block the DC voltage present on $V_{supply}$ line 42. While a single DC blocking capacitor could be used, employing two capacitors as a voltage divider scales down the magnitude of the incoming glitch (which is a function of the power supply voltage level) and thus provides the ability to use the same detection circuit to detect glitches on any power supply level. The capacitance ratio of capacitors 44 and 48 is variable and is dependent on the level of the power supply.

A adjustable voltage biasing circuit (shown within dashed lines 50) is used to bias the input of the detection circuit to a voltage level $V_{bias}$ to a predetermined level below $V_{trip}$ in steady state, with a steady state difference of $\Delta V$. The adjustable voltage biasing circuit 50 employs an inverter 52 having its input connected to its output. This connection sets the output of inverter 52 at its trip point $V_{trip}$. Inverter 52 is matched to sensing inverter 46 so that both inverters 46 and 52 have the same trip point voltage $V_{trip}$. The trip point of the inverter 52 is set to be the same as the trip point of the sensing inverter 46 in order to allow the bias circuit 50 to set the bias of the sensing inverter 46 accordingly.

A series string of resistors $R_1$, $R_2$, $R_3$, $R_4$, $R_5$, and $R_6$, identified respectively by reference numerals 54, 56, 58, 60, 62, and 64 are coupled between the output of inverter 52 and an n-channel current bias transistor 66. N-channel current bias transistor 66 has its gate set at a voltage to cause a constant current bias to flow through the series string of resistors.

A first bias transistor 68 is coupled between the common connection of resistors $R_3$ and $R_4$ and the input of sensing inverter 46. Its gate is coupled to a control signal thresh_ctrl_1. A second bias transistor 70 is coupled between the common connection of resistors $R_4$ and $R_5$ and the input of sensing inverter 46. Its gate is coupled to a control signal thresh_ctrl_2. A third bias transistor 72 is coupled between the common connection of resistors $R_5$ and $R_6$ and the input of sensing inverter 46. Its gate is coupled to a control signal thresh_ctrl_3. A fourth bias transistor 74 is coupled between the common connection of resistor $R_6$ and the drain of current bias transistor 66 and the input of sensing inverter 46. Its gate is coupled to a control signal thresh_ctrl_4. Persons of ordinary skill in the art will appreciate that $R_1$ through $R_3$ are formed separately to keep the unit resistor value the same throughout the ladder to ensure good resistor matching.

The several voltage bias levels generated inside the adjustable voltage biasing circuit 50 are calculated as follows:

$$V_{bias1} = V_{trip} - I_{bias} * (R_1 + R_2 + R_3) \quad (1)$$

$$V_{bias2} = V_{trip} - I_{bias} * (R_1 + R_2 + R_3 + R_4) \quad (2)$$

$$V_{bias3} = V_{trip} - I_{bias} * (R_1 + R_2 + R_3 + R_4 + R_5) \quad (3)$$

$$V_{bias4} = V_{trip} - I_{bias} * (R_1 + R_2 + R_3 + R_4 + R_5 + R_6) \quad (4)$$

One of the control inputs, thresh_ctrl_1, thresh_ctrl_2, thresh_ctrl_3, and thresh_ctrl_4, is activated to provide any of the above four bias levels to the input of the sensing inverter 46 through one of bias transistors 68, 70, 72, and 74. The signals used to drive the gates of transistors 68, 70, 72, and 74 may be provided by a one-of-four decoder as is known in the art. The resistance values of resistors $R_1$-$R_6$ are selected to provide control for the bias voltage supplied to the sensing inverter 46. In one exemplary non-limiting embodiment of the invention, the resistance values of resistors $R_1$-$R_6$ are selected to provide selectable glitch amplitude thresholds ($\Delta V$) for $V_{bias1}$ through $V_{bias4}$ of +15%, +20%, +25%, and +30% of $V_{supply}$ respectively.

As an example, assume that thresh_ctrl_1 is set to active so as to turn on transistor 68 and thereby apply $V_{bias1}$ to the input of sensing inverter 46. Therefore $V_{bias} = V_{trip} - I_{bias} * (R_1 + R_2 + R_3) = V_{bias1}$. In case there is any positive glitch (of magnitude $V_{glitch}$) on the voltage supply, it gets coupled to the input of sensing inverter 46 through capacitor 44. This positive glitch causes $V_{bias}$ to temporarily become $V_{bias} + V_{glitch}$.

If $V_{bias} + V_{glitch} > V_{trip}$, the sensing inverter 46 trips and generates a short pulse the duration of which is essentially equal to the time that the glitch maintains $V_{bias} + V_{glitch}$ at a voltage level higher than $V_{trip}$. Similar analyses that will be well understood by persons of ordinary skill in the art apply for turning on other ones of transistors 70, 72, and 74.

Inverter 76 and buffer 78 along with a glitch width filter 80, illustrated without limitation as an RC filter 80, and a pulse stretching circuit 84 in FIG. 3 are used to stretch the pulse and generate an output of the glitch detector circuit 40. Pulse stretching circuit 84 further acts as an inverter for the output pulse. Width_Control input 82 to the RC filter sets the desired minimum glitch width below which no glitch is intended to be detected. The inverters 46 and 76 are supplied by regulated supplies. Inverters 46 and 76 may be powered using different voltage supplies. For example, the sensing inverter 46 may be driven by 1.5V regulated supply and the inverter 76 may driven by a higher supply voltage level (e.g., 1.8V). The sensing inverter 46 should preferably be driven by same supply as the biasing inverter 52 to set the proper bias. The power supply for inverter 76 may be at a higher voltage level to strengthen it for better switching characteristics. Inverter 76 and buffer 78 along with RC filter 80 and pulse stretching circuit 84 in FIG. 3 are used to stretch the pulse and generate an output of the glitch detector circuit 40. Width_Control input 82 to the RC filter sets the desired minimum width below which no glitch is intended to be detected. The inverters 46 and 76 are supplied by regulated supplies. Inverters 46 and 76 may be powered using different voltage supplies. For example, the sensing inverter 46 may be driven by 1.5V regulated supply and the inverter 76 may driven by a higher supply voltage level (e.g., 1.8V). The sensing inverter 46 should preferably be driven by same supply as the biasing inverter 52 to set the proper bias. The power supply for inverter 76 may be at a higher voltage level to strengthen it for better switching characteristics. This is because the detector sensing inverter 46 may switch weakly depending on the magnitude of the incoming glitch. For example, this may happen if the glitch magnitude is just slightly above/below the trip point and the sensing inverter 46 in this case may not provide a clean 0/1 as its output. The subsequent inverter 76 being driven at a higher supply helps to resolve the next stages.

Figure 4:
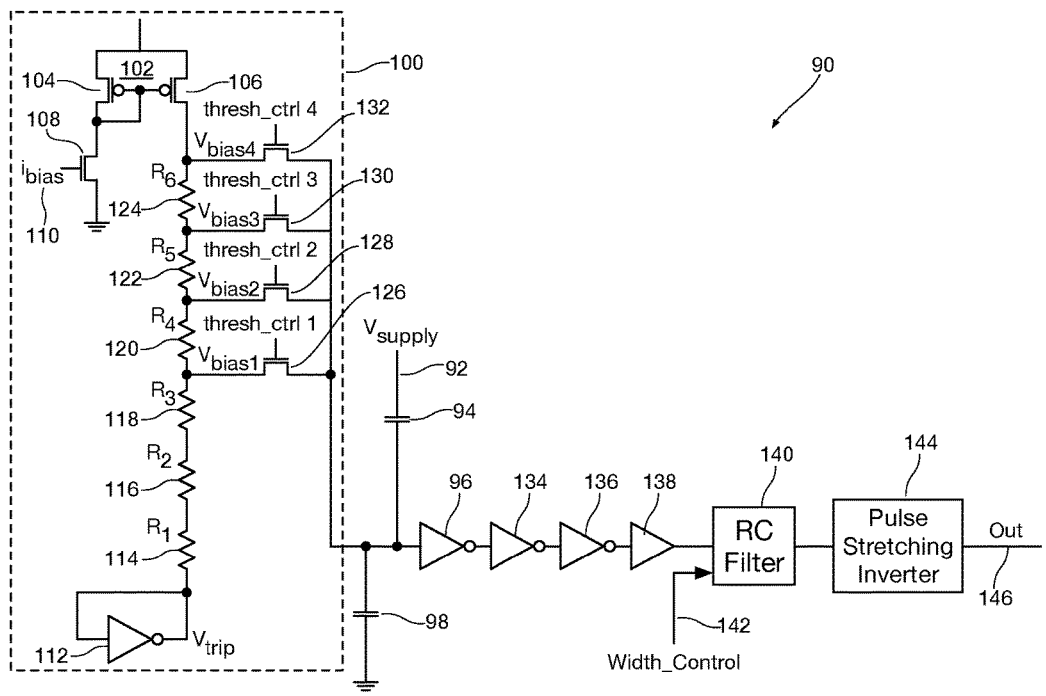
FIG. 4 is a schematic diagram showing an illustrative circuit implementation of the glitch detector of FIG. 2 where the bias generator circuit and the glitch detection circuit are configured to detect a negative-going glitch.

Referring now to FIG. 4, a schematic diagram shows an illustrative circuit implementation of the glitch detector of FIG. 2 where the bias generator circuit and the glitch detection circuit are configured to detect a negative-going glitch.

The detection circuit 90 shown in FIG. 4 monitors the voltage on $V_{supply}$ line 92, acting as a power supply node. A first capacitor 94 is coupled between the $V_{supply}$ line 92 and the input of sensing inverter 96, acting as a sensing node. A second capacitor 98 is coupled between the input of sensing inverter 96 and ground. Capacitors 94 and 98 act as a voltage divider for the glitch pulse, with capacitor 94 also acting to block the DC voltage present on $V_{supply}$ line 92.

An adjustable voltage biasing circuit (shown within dashed lines 100) is used to bias the input of the detection circuit to a voltage level $V_{bias}$ which is set to be $\Delta V$ volts below $V_{trip}$ in steady state. The adjustable voltage biasing circuit 100 employs a current mirror 102 formed from p-channel transistors 104 and 106. A voltage 110 at the gate of an n-channel transistor 108 sets the current value $i_{bias}$ flowing though transistor 104, which is mirrored by p-channel transistor 106.

An inverter 112 has its input connected to its output. This connection sets the output of inverter 112 at its trip point $V_{trip}$. As explained above with reference to the positive glitch detector of FIG. 3. inverter 112 is preferably matched to sensing inverter 96 so that both inverters 96 and 112 have the same trip point voltage $V_{trip}$. The only difference between the circuit of FIG. 4 and the circuit discussed with reference to FIG. 3 is that the bias generation circuit 100 of FIG. 4 sets the steady-state $V_{bias}$ voltage to a level which is above the voltage $V_{trip}$ of sensing inverter 96 by the preset known amount 4V.

A series string of resistors $R_1$, $R_2$, $R_3$, $R_4$, $R_5$, and $R_6$, identified respectively by reference numerals 114, 116, 118, 120, 122, and 124, is coupled between the output of inverter current mirror 102 and inverter 112. A constant current $i_{bias}$ set by transistor 108, and mirrored by current mirror 102, flows through the series string of resistors. The inverter 112 sets the voltage at the bottom end of resistor $R_6$ at $V_{trip}$.

A first bias transistor 126 is coupled between the common connection of resistors $R_3$ and $R_4$ and the input of sensing inverter 96. Its gate is coupled to a control signal thresh_ctrl_1. A second bias transistor 128 is coupled between the common connection of resistors $R_4$ and $R_5$ and the input of sensing inverter 96. Its gate is coupled to a control signal thresh_ctrl_2. A third bias transistor 130 is coupled between the common connection of resistors $R_5$ and $R_6$ and the input of sensing inverter 96. Its gate is coupled to a control signal thresh_ctrl_3. A fourth bias transistor 132 is coupled between the common connection of resistor $R_6$ and the output of inverter 112 and the input of sensing inverter 96. Its gate is coupled to a control signal thresh_ctrl_4.

The several voltage bias levels generated inside the adjustable voltage biasing circuit 100 are calculated as follows:

$$V_{bias1} = V_{trip} + I_{bias} * (R_1 + R_2 + R_3) \quad (1)$$

$$V_{bias2} = V_{trip} + I_{bias} * (R_1 + R_2 + R_3 + R_4) \quad (2)$$

$$V_{bias3}=V_{trip}+I_{bias}*(R_1+R_2+R_3+R_4+R_5) \quad (3)$$

$$V_{bias4}=V_{trip}+I_{bias}*(R_1+R_2+R_3+R_4+R_5+R_6) \quad (4)$$

A control circuitry (not shown) activates one of thresh_ctrl_1, thresh_ctrl_2, thresh_ctrl_3, and thresh_ctrl_4, to provide any of the above four bias levels to the input of the sensing inverter 96 through one of bias transistors 126, 128, 130, and 132. The signals used to drive the gates of transistors 126, 128, 130, and 132 may be provided by a one-of-four decoder as is known in the art. The resistance values of resistors $R_1$-$R_6$ are selected to provide control for the voltage supplied to the sensing inverter 96. In one exemplary non-limiting embodiment of the invention, the resistance values of resistors $R_1$-$R_6$ are selected to provide different glitch amplitude thresholds for $V_{bias1}$ through $V_{bias4}$ of −15%, −20%, −25%, and −30% of $V_{supply}$, respectively.

As an example, assume that thresh_ctrl_1 is applied to the gate of transistor 126 to turn it on and apply $V_{bias1}$ to the input of sensing inverter 96. Therefore $V_{bias}=V_{trip}+I_{bias}*(R_1+R_2+R_3)$. In case there is any negative glitch (of magnitude $V_{glitch}$) on the voltage supply, it gets coupled to the input of sensing inverter 96 through capacitor 94. This negative glitch causes $V_{bias}$ to temporarily become $V_{bias}-V_{glitch}$.

If $V_{bias}-V_{glitch}<V_{trip}$, the sensing inverter 96 trips and generates a short pulse the duration of which is essentially equal to the time that the glitch maintains $V_{bias}$ at a voltage level lower than $V_{trip}$. Similar analyses that will be well understood by persons of ordinary skill in the art apply for turning on other ones of transistors 128, 130, and 132.

Inverters 134, 136, and buffer 138 along with glitch width filter 140, illustrated without limitation as an RC filter 140, and pulse stretching circuit 144 in FIG. 4 are used to stretch the pulse and generate an output of the glitch detector circuit 90. Pulse stretching circuit 144 further acts as an inverter. Width_Control input 142 to the RC filter sets the desired minimum glitch width below which no glitch is intended to be detected Referring now to FIG. 5, a schematic diagram shows an exemplary circuit that can be used to implement the glitch width filter filter 80 and 140, respectively, of the circuits shown in FIGS. 3 and 4 as variable pulse width filters. The RC filter 80 (140) functions as a glitch width filter and is used to filter out any unintended glitches that have pulse widths below a minimum width that a user desires to detect.

An input node 152 is connected to the input of an inverter 154. The output of inverter 154 is connected to the input of an inverter 156 through resistor 158. The output of inverter 156 is connected to an output node 160.

Figure 5:
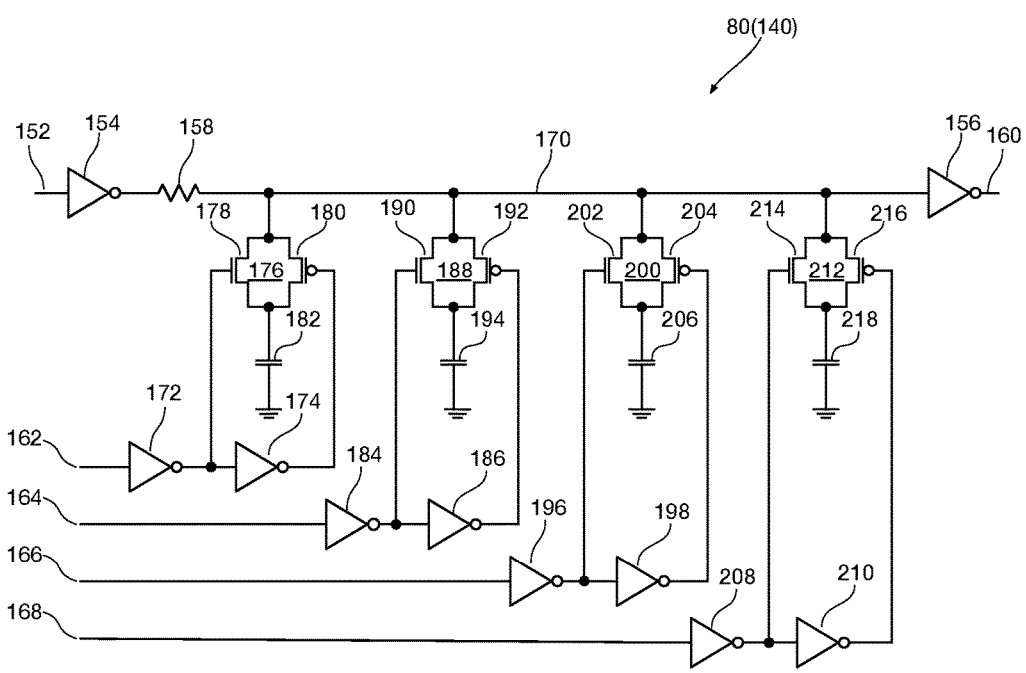
FIG. 5 is a schematic diagram of an exemplary circuit that can be used to implement the RC filter of the circuits shown in FIGS. 3 and 4.

In the embodiment of the RC filter shown in FIG. 5, the Width_Control 82 (142) includes four bit inputs 162, 164, 166, and 168, that are used select an appropriate capacitance value for the RC filter.

The RC filter inserts the capacitance in the common node 170 that is both the output of inverter 154 and the input of inverter 156. Width control bit input 162 is connected to series connected inverters 172 and 174 that are used to control a passgate 176. Passgate 176 is formed from n-channel transistor 178 and p-channel transistor 180. The gate of n-channel transistor 178 is connected to the output of inverter 172 and the gate of p-channel transistor 180 is connected to the output of inverter 174. The passgate 176 connects capacitor 182 to common node 170.

Similarly, width control bit input 164 is connected to series connected inverters 184 and 186 that are used to control a passgate 188. Passgate 188 is formed from n-channel transistor 190 and p-channel transistor 192. The gate of n-channel transistor 190 is connected to the output of inverter 184 and the gate of p-channel transistor 192 is connected to the output of inverter 186. The passgate 188 connects capacitor 194 to common node 170. Width control bit input 166 is connected to series connected inverters 196 and 198 that are used to control a passgate 200. Passgate 200 is formed from n-channel transistor 202 and p-channel transistor 204. The gate of n-channel transistor 202 is connected to the output of inverter 196 and the gate of p-channel transistor 204 is connected to the output of inverter 198. The passgate 200 connects capacitor 206 to common node 170. Width control bit input 168 is connected to series connected inverters 208 and 210 that are used to control a passgate 212. Passgate 212 is formed from n-channel transistor 214 and p-channel transistor 216. The gate of n-channel transistor 214 is connected to the output of inverter 208 and the gate of p-channel transistor 216 is connected to the output of inverter 210. The passgate 212 connects capacitor 218 to common node 170.

At any one time, one or more of capacitors 182, 194, 206, and 218 can be connected to common node 170 to form the RC filter in cooperation with resistor 158. As will be appreciated by persons of ordinary skill in the art, the width control bit inputs 160, 162, 164, and 166 can be controlled by a one-of four decoder to turn on only one of passgates 176, 188, 200, and 212 or may be individually controlled to turn on any number of passgates 176, 188, 200, and 212. As previously noted, the RC filter 80 (140) is used to filter out any glitches that are not intended to be detected. Persons of ordinary skill in the art are readily enabled to choses the values for capacitors 182, 194, 206, and 218 accordingly. As a non-limiting example, with resistor 158 having a resistance value of 16K ohms, a capacitance value of 100 fF will filter out 1.6 ns glitches, a capacitance value of 200 fF will filter out 3.2 ns glitches, and a capacitance value of 300 fF will filter out 4.8 ns glitches.

Figure 6:
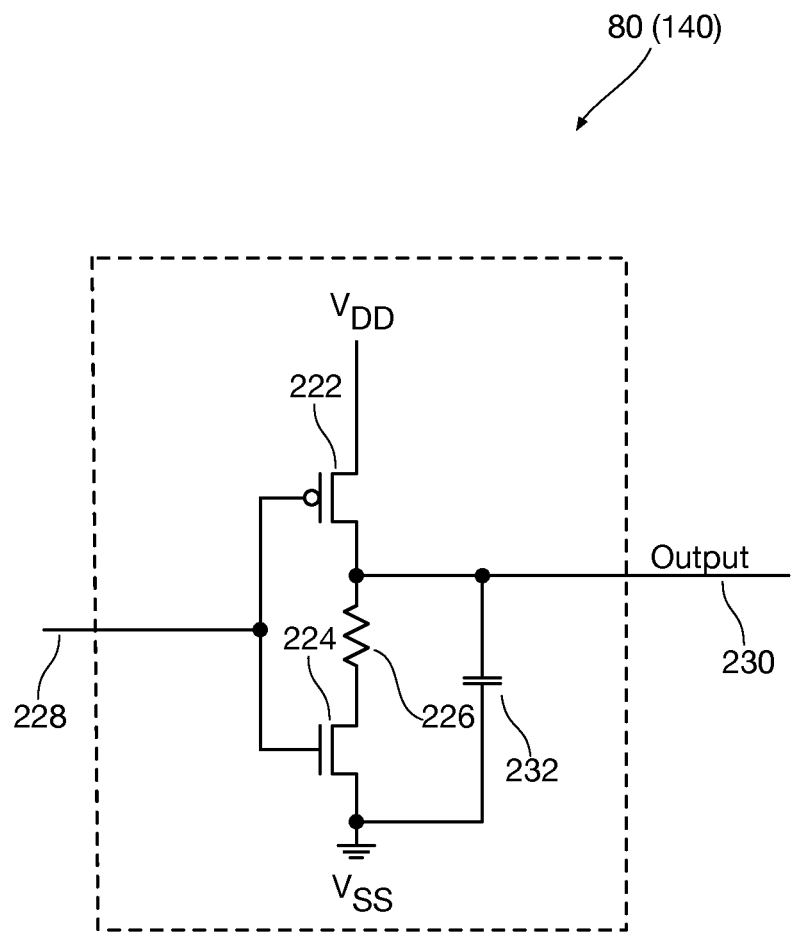
FIG. 6 is a schematic diagram of an exemplary circuit that can be used to implement the pulse stretching inverter of the circuits shown in FIGS. 3 and 4.

Referring now to FIG. 6, a schematic diagram shows an exemplary circuit that can be used to implement the pulse stretching circuits 84 and 140, respectively, of the circuits shown in FIGS. 3 and 4.

A p-channel transistor 222 and n-channel transistor 224 are connected in series with a resistor 226 in series with their drains. The source of the p-channel transistor 222 is connected to a voltage supply VDD and the source of the n-channel transistor 224 is connected to VSS (ground). The gates of p-channel transistor 222 and n-channel transistor 224 are connected together to the input 228, which represents the output of the RC filter 80 (140). The common connection of the drain of p-channel transistor 222 and the resistor 226 forms the output node 230 of the pulse stretching circuit 84 (144). A capacitor 232 is connected between the output node 230 and the source of the n-channel transistor 224.

The pulse stretching circuit 84 (144) provides a weak pull-down/pull-up path to delay the switching of the input signal. The pull-down path through n-channel transistor 224 is made more resistive by adding the resistor 226 in series with the n-channel transistor 226. The pull-up path through p-channel transistor 222 is shunted by capacitor 232 to provide a delayed rising of the output. As an example, R and C values of R=200KΩ, C=128 fF will together give a delay of ~25 ns.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A power supply glitch detector comprising:
a sensing node AC coupled to a power supply node on which positive voltage glitches having a magnitude of at least $V_{glitch}$ are to be detected;
a sensing inverter having an input and an output, the input coupled to the sensing node, the sensing inverter having a trip voltage $V_{trip}$ below which the output of the sensing inverter is at a voltage representing a logic high state and above which the output of the sensing inverter is at a voltage representing a logic low state; and
a user-settable voltage biasing circuit coupled to the sensing node to maintain the input of the sensing inverter at a settable bias voltage $V_{bias}$, wherein $V_{bias}$ is chosen such that both conditions ($V_{bias}<V_{trip}$) and ($V_{bias}+V_{glitch}>V_{trip}$) are always true.

2. The power supply glitch detector of claim 1 wherein the sensing node is AC coupled by a capacitor voltage divider to the power supply node on which positive voltage glitches having a magnitude of at least $V_{glitch}$ are to be detected.

3. The power supply glitch detector of claim 1 further comprising a glitch width filter coupled to the output of the sensing inverter.

4. The power supply glitch detector of claim 3 wherein the glitch width filter is a variable pulse width filter.

5. The power supply glitch detector of claim 1 further comprising a pulse stretching circuit coupled to the output of the sensing inverter.

6. The power supply glitch detector of claim 1 wherein the user-settable voltage biasing circuit comprises:
a series string of resistors;
an inverter having a trip voltage $V_{trip}$ equal to the trip voltage of the sensing inverter, the inverter having an input and an output connected together to a first end of the series string of resistors;
an n-channel transistor having a drain coupled to a second end of the series string of resistors, a source coupled to ground, and a gate coupled to a voltage potential selected to cause a predetermined current to flow through the series string of resistors;
a first select transistor coupled between the drain of the n-channel transistor and the sensing node, the first select transistor having a gate coupled to a first control signal; and
a second select transistor coupled between a common connection of a first adjacent pair of resistors in the series string of resistors and the sensing node, the second select transistor having a gate coupled to a second control signal.

7. The power supply glitch detector of claim 6 wherein the user-settable voltage biasing circuit further comprises:
a third select transistor coupled between a common connection of a second adjacent pair of resistors in the series string of resistors and the sensing node, the third select transistor having a gate coupled to a third control signal.

8. A power supply glitch detector comprising:
a sensing node AC coupled to a power supply node on which negative voltage glitches having a magnitude of at least $V_{glitch}$ are to be detected;
a sensing inverter having an input and an output, the input coupled to the sensing node, the sensing inverter having a trip voltage $V_{trip}$ below which the output of the sensing inverter is at a voltage representing a logic high state and above which the output of the sensing inverter is at a voltage representing a logic low state;
a user-settable voltage biasing circuit coupled to the sensing node to maintain the input of the sensing inverter at a settable bias voltage $V_{bias}$, wherein $V_{bias}$ is chosen such that both conditions ($V_{bias}>V_{trip}$) and ($V_{bias}-V_{glitch}<V_{trip}$) are always true.

9. The power supply glitch detector of claim 8 wherein the sensing node is AC coupled by a capacitor voltage divider to the power supply node on which negative voltage glitches having a magnitude of at least $V_{glitch}$ are to be detected.

10. The power supply glitch detector of claim 8 further comprising a glitch width filter coupled to the output of the sensing inverter.

11. The power supply glitch detector of claim 10 wherein the glitch width filter is a variable pulse width filter.

12. The power supply glitch detector of claim 8 further comprising a pulse stretching circuit coupled to the output of the sensing inverter.

13. The power supply glitch detector of claim 8 wherein the user-settable voltage biasing circuit comprises:
a series string of resistors;
a current mirror supplying a current $i_{bias}$ connected to a first end of the series string of resistors;
an inverter having a trip voltage $V_{trip}$ equal to the trip voltage of the sensing inverter, the inverter having an input and an output connected together to a second end of the series string of resistors;
a first select transistor coupled between the output of the current mirror and the sensing node, the first select transistor having a gate coupled to a first control signal; and
a second select transistor coupled between a common connection of a first adjacent pair of resistors in the series string of resistors and the sensing node, the second select transistor having a gate coupled to a second control signal.

14. The power supply glitch detector of claim 13 wherein the user-settable voltage biasing circuit further comprises:
a third select transistor coupled between a common connection of a second adjacent pair of resistors in the series string of resistors and the sensing node, the third select transistor having a gate coupled to a third control signal.

15. A power supply glitch detector comprising:
a first sensing node AC coupled to a power supply node on which positive voltage glitches having a magnitude of at least $V_{glitch+}$ are to be detected;
a first sensing inverter having an input and an output, the input coupled to the first sensing node, the first sensing inverter having a trip voltage $V_{trip+}$ below which the output of the first sensing inverter is at a voltage representing a logic high state and above which the output of the first sensing inverter is at a voltage representing a logic low state;
a first user-settable voltage biasing circuit coupled to the first sensing node to maintain the input of the first sensing inverter at a settable bias voltage $V_{bias+}$, wherein $V_{bias+}$ is chosen such that both conditions ($V_{bias+}<V_{trip+}$) and ($V_{bias+}+V_{glitch+}>V_{trip+}$) are always true;
a second sensing node AC coupled to a power supply node on which negative voltage glitches having a magnitude of at least $V_{glitch-}$ are to be detected;
a second sensing inverter having an input and an output, the input coupled to the second sensing node, the second sensing inverter having a trip voltage $V_{trip-}$ below which the output of the second sensing inverter is at a voltage representing a logic high state and above which the output of the second sensing inverter is at a voltage representing a logic low state;

a second user-settable voltage biasing circuit coupled to the second sensing node to maintain the input of the second sensing inverter at a settable bias voltage $V_{bias-}$, wherein $V_{bias-}$ is chosen such that both conditions $(V_{bias-}>V_{trip-})$ and $(V_{bias-}-V_{glitch-}<V_{trip-})$ are always true.

16. The power supply glitch detector of claim 15 wherein:

the first sensing node is AC coupled by a first capacitor voltage divider coupled to the power supply node on which positive voltage glitches having a magnitude of at least $V_{glitch+}$ are to be detected; and the second sensing node is AC coupled by a second capacitor voltage divider coupled to the power supply node on which negative voltage glitches having a magnitude of at least $V_{glitch-}$ are to be detected.

17. The power supply glitch detector of claim 16 further comprising:

a first glitch width filter coupled to the output of the first sensing inverter; and a second glitch width filter coupled to the output of the second sensing inverter.

18. The power supply glitch detector of claim 17 wherein the first and second glitch width filters are variable pulse width filters.

19. The power supply glitch detector of claim 16 further comprising:

a first pulse stretching circuit coupled to the output of the first sensing inverter; and a second pulse stretching circuit coupled to the output of the second sensing inverter.

* * * * *